US008797053B2

(12) United States Patent
Rutigliano et al.

(10) Patent No.: US 8,797,053 B2
(45) Date of Patent: Aug. 5, 2014

(54) POSITIONING AND SOCKETING FOR SEMICONDUCTOR DICE

(75) Inventors: Michael L. Rutigliano, Chandler, AZ (US); Eric J. M. Moret, Beaverton, OR (US); David Shia, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 13/114,876

(22) Filed: May 24, 2011

(65) Prior Publication Data

US 2012/0299609 A1 Nov. 29, 2012

(51) Int. Cl.
*G01R 31/00* (2006.01)
*G01R 1/073* (2006.01)

(52) U.S. Cl.
CPC .................... *G01R 1/0735* (2013.01)
USPC ................ 324/750.03; 324/754.14

(58) Field of Classification Search
None
See application file for complete search history.

(56) References Cited

U.S. PATENT DOCUMENTS

| 5,225,037 A * | 7/1993 | Elder et al. ............. 216/18 |
| 5,325,052 A * | 6/1994 | Yamashita ............ 324/750.08 |
| 5,559,446 A * | 9/1996 | Sano ..................... 324/750.03 |
| 5,604,446 A * | 2/1997 | Sano ..................... 324/754.16 |
| 5,982,183 A * | 11/1999 | Sano ..................... 324/750.05 |
| 6,350,957 B1 * | 2/2002 | Shingai et al. ............. 174/254 |
| 2005/0014394 A1 * | 1/2005 | Hedler et al. .............. 439/55 |
| 2005/0117305 A1 | 6/2005 | Ulen et al. |
| 2006/0261826 A1 * | 11/2006 | Ito ........................ 324/754 |
| 2009/0302878 A1 * | 12/2009 | Sherry et al. ............. 324/762 |
| 2010/0151598 A1 | 6/2010 | Moret et al. |
| 2011/0109335 A1 | 5/2011 | Schroeder et al. |

OTHER PUBLICATIONS

U.S. Appl. No. 12/888,579; "Micro Positioning Test Socket and Methods for Active Precision Alignment and Co-Planarity Feedback," filed Sep. 23, 2010.
Advantest Corporation product literature for M4741A "Dynamic Test Handler," printed from website at http://www.advantest.co.jp/products/ate/m4741a/en-index.shtml, on May 5, 2011.

* cited by examiner

*Primary Examiner* — Paresh Patel

(57) ABSTRACT

Devices and methods useful for testing bare and packaged semiconductor dice are provided. As integrated circuit chips become smaller and increasingly complex, the interface presented by a chip for connectivity with power supplies and other components of the system into which it is integrated similarly becomes smaller and more complex. Embodiments of the invention provide micron-scale accuracy alignment capabilities for fine pitch device first level interconnect areas. Embodiments of the invention employ air-bearings to effectuate the movement and alignment of a device under test with a testing interface. Additionally, testing interfaces comprising membranes supported by thermal fluids are provided.

21 Claims, 7 Drawing Sheets

POSITIONING AND SOCKETING FOR SEMICONDUCTOR DICE

BACKGROUND OF THE INVENTION

1. Field of the Invention

Embodiments of the present invention relate generally to positioning, socketing, and alignment of fine pitch bare and packaged semiconductor dice and testing systems for bare and packaged semiconductor dice.

2. Background Information

The push for ever-smaller integrated circuits (IC) places enormous performance demands on the techniques and materials used to construct IC devices. In general, an integrated circuit chip is also known as a microchip, a silicon chip, a chip, or a die. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips (dies or dice).

As part of the manufacturing process, individual dice are tested to confirm the functioning of the die and provide feedback for the manufacturing process. Testing complex semiconductor dice under controlled electrical, thermal, and mechanical conditions in a cost-effective manner presents challenges as the size of IC chips shrinks and the number of features associated with an individual chip increases.

DETAILED DESCRIPTION OF THE INVENTION

Embodiments of the present invention provide devices and methods useful for testing bare and packaged semiconductor dice. Electrical, thermal, and or mechanical conditions are capable of being controlled during a die testing operation. Embodiments of the invention provide micron-scale accuracy alignment capabilities for fine pitch device areas (e.g., bumps or pads for electrical connectivity). As integrated circuit chips become smaller and increasingly complex, the interface presented by a chip for connectivity with power supplies and other components of the system into which it is integrated similarly becomes smaller and more complex. In order to test the functioning and operation of the chip, the interface presented by the chip for connectivity must be aligned with an interface of a testing device. As the chip interface decreases in size the tolerance for misalignment of the chip with a testing interface shrinks and the difficulty of designing a system to cost-effectively test integrated circuit chips increases.

Figure 1:
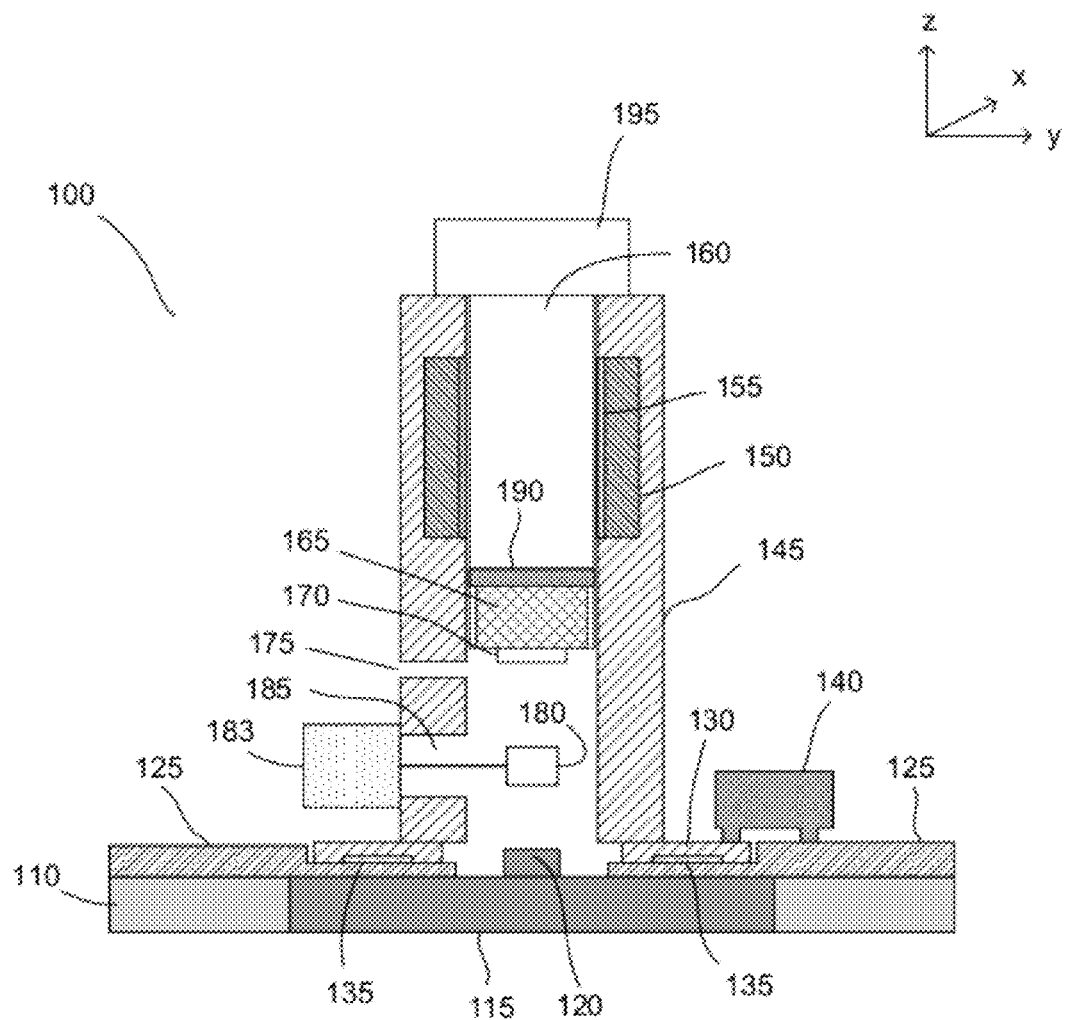
FIG. 1 illustrates an alignment stage useful for aligning semiconductor integrated circuit chips with a test interface.

FIG. 1 provides an exemplary alignment stage 100 that is capable of high-precision alignment and socketing of a semiconductor die with a testing interface used for testing integrated circuit chips. The alignment stage 100 of FIG. 1 is capable of testing dice that are bare and dice that have been packaged. Further, the device 100 of FIG. 1 is capable of handling and aligning dice having interconnects with pitches of 100 μm or less with an alignment accuracy of 3 μm or less and theta of 0.003° or less in the x-y plane. In FIG. 1, a base plate 110 holds testing tool 115 having testing interface 120. Testing interface 120 provides probes (not shown) that are capable of contacting and connecting electrically to the interconnects of a device under test (a die). A lapped surface plate 125 holds air bearing plate 130. Air bearing plate 130 comprises porous air bearing region 135. In operation of the alignment stage 100, the porous air bearing region 135 delivers a pressurized gas to the interface region between the air bearing plate 130 and the proximate surface under air bearing plate 130 (in FIG. 1 the proximate surface is provided by lapped surface plate 125). The pressurized gas delivery facilitates the translation of air bearing plate 130 in the x and y directions and rotation in the x-y plane (theta rotation). Lapped surface plate 125 limits the amount of translation that is possible in the x and y plane. Optionally, manipulator 140 and two other manipulators (not shown) that are placed in the same plane as manipulator 140, are capable of effectuating translation and rotation of the air bearing plate 130. In an embodiment of the invention, manipulator 140 is rotably attached to lapped surface plate 125 (or a different surface) and rotably attached to air bearing plate 130. Manipulators 140 are motors, for example, a set of actuators such as voice coil motors mounted inside cylinders or chain manipulators. Air bearing plate 130 is attached to (or part of) housing 145. Other configurations are possible for manipulator 140 that are capable of providing x, y, theta translation.

Housing 145 comprises one or more porous air bearings 150 that facilitate the translation of actuation member 160 in the z direction. Air bearing 150 comprises porous air bearing region 155. Porous air bearing region 155 is capable of delivering a pressurized gas to the interface region between the actuation member 160 and porous air bearing region 155. A housing 145 that has a square footprint comprises, for example, four air bearing regions 155 or a four-sided air-bearing collar. The actuation member 160 comprises a thermal control unit 165. The thermal control unit 165 is capable of maintaining the temperature of a device under test 170. In an embodiment of the invention, in operation, a pick-and-place head (not shown) hands off the die though access region 175 to thermal control unit 165. Thermal control unit 165 comprises regions through which a vacuum is applied to hold die 170 against thermal control unit 165. Thermal control unit 165 is also a chuck or pedestal for holding die 170. In embodiments of the invention a solenoid valve (not shown) opens to turn on the vacuum and evacuate the lines holding the die 170 up against the thermal control unit 165. In embodiments of the invention, vacuum application microchannels additionally allow a temperature control liquid to flow against the reverse side of the die 170 once the actuation member 160 is actuated compressing the die 170 against the test interface 120. Other devices employing different methods of thermal management are also possible, such as heating and cooling elements and liquids that flow within the thermal control unit 165 but do not contact the backside of the die 170.

Before the actuation member 160 is actuated to allow the die 170 to contact the testing interface 120, the die 170 interface is aligned with the testing interface 120. An optical system comprising retractable optics 180, an optional lighting system (not shown), and imager 183 (an image capturing device) allows the simultaneous viewing of both the interconnect region of a die 170 and the testing interface 120. Imager 183 is, in embodiments of the invention, a camera. The imager may be fixed to the housing 145 or robot mounted. Housing 145 has access region 185 through which an optical system accesses the interior of the housing and into which the retractable optics 180 retract to allow translation of the vertical actuation member 160 along the z-axis. A computer (not shown) is capable of receiving the images from the optical system and activating parallel manipulators 140 to align the die 170 with the testing interface 120. Alignment algorithms, such as best fit algorithms, drive the alignment of the die 170 with the testing interface 120. In embodiments of the invention, an image of one corner of the die is used to align the die with the testing interface. Although, access region 175 is shown as aligned with access region 185, these regions are not necessarily aligned as shown, and might, for example, be located in the same plane. In an alternate embodiment, the two separate access regions 175 and 185 are combined into one region and the retractable optics 180 are also capable of carrying a die into and out of the interior chamber of the housing 145.

The actuation member 160 additionally comprises a force sensor 190 that is capable of detecting the amount of force applied to the device under test 170 when it is in contact with the testing interface 120. The output from the force sensor 190 is provided to the computer (not shown) running software controlling the operation of the motor 195 so that a controlled amount of force is applied between the die 170 and testing interface. Other locations are possible for the force sensor 190 that allow the force sensor 190 to measure the force between the die 170 and the testing interface 120. The motor 195 is capable of causing the actuation member 160 to extend along the z-axis within the housing 145. In embodiments of the invention, the motor 195 is a linear stepper motor.

Figure 2:
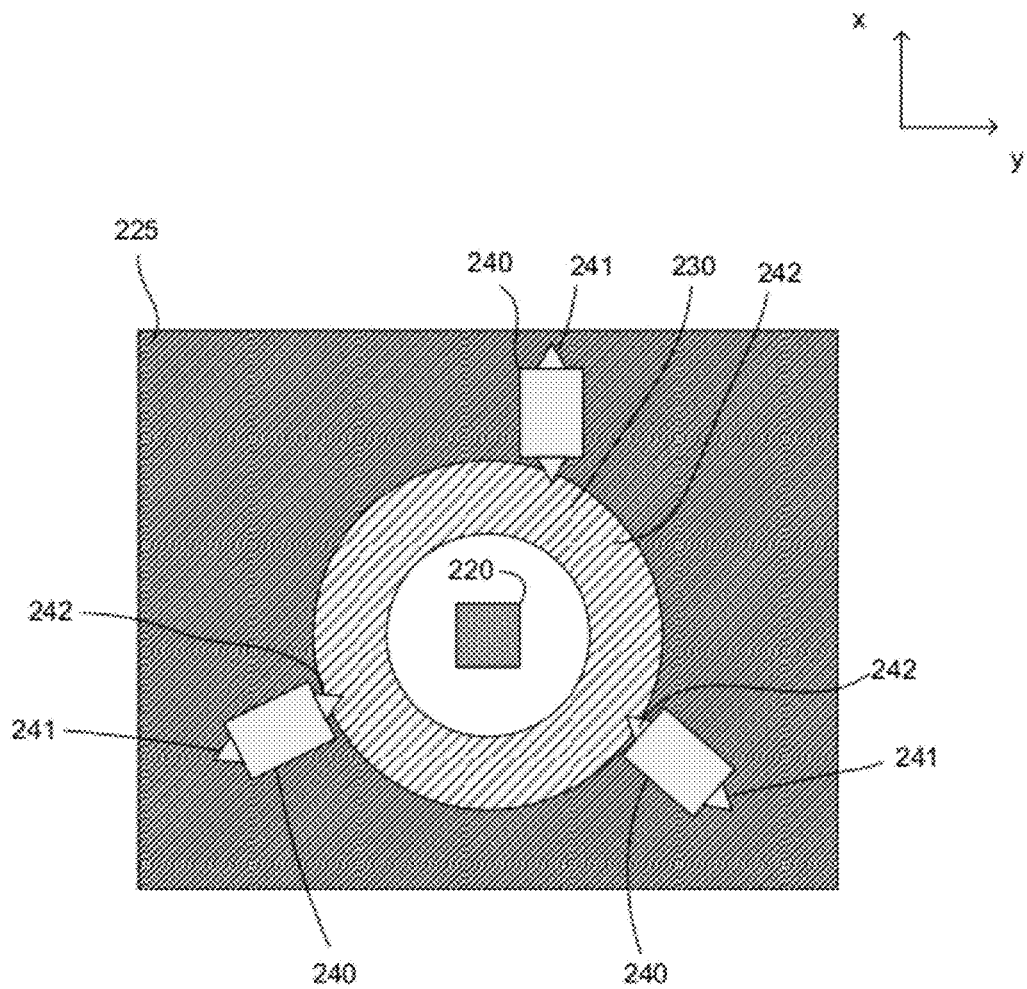
FIG. 2 provides a view of an air bearing plate and motors capable of translating and or rotating the air bearing plate of FIG. 1 in the x-y plane.

According to an embodiment of the invention, FIG. 2 provides a view along the z-axis of the air bearing plate of FIG. 1. In FIG. 2, testing interface 220 is mounted against lapped surface plate 225. Parallel manipulators 240 allow air bearing plate 130 to be translated and rotated (theta rotation) in the x-y plane. Parallel manipulators 240 have outermost attachment points 241 that are rotably attached to the lapped surface plate 225 or other stationary surface. Each parallel manipulator 240 has a second attachment point 242, a pivot point, movably attached to the air bearing plate 230. In operation, the air bearing plate 230 is supported by a cushion of air supplied through porous air bearing region (not shown) which facilitates high precision movement of the alignment stage. In an embodiment of the invention, porous air bearing region is a series of concentric circles. Other configurations are possible for manipulators capable of moving the air bearing plate 230. Air bearing plate 230 is attached to the housing (not shown) in which the device under test is mounted.

Figure 3:
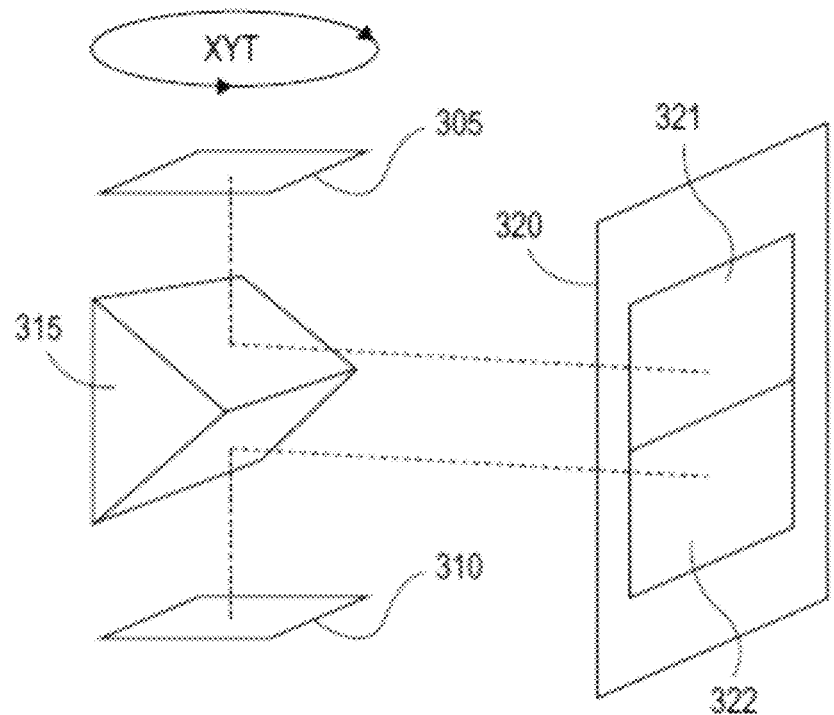
FIG. 3 shows an optical system capable of imaging a die under test and a testing interface useful for aligning semiconductor integrated circuit chips with a test interface.

FIG. 3 describes an embodiment of an optical system that is capable of facilitating the alignment of a device under test mounted in an alignment stage with a testing interface. In FIG. 3, the device under test 305 is mounted inside a microstage (not shown) that is capable of translating and rotating the die 305 in the x-y plane. The device under test 305 is a packaged or an upackage die. The interior of the alignment stage optionally comprises lights (not shown) that are, for example, LEDs, and that are capable of illuminating the surface of the die 305 and the testing interface 310. Optionally, lights (not shown) are attached to the optics 315. Images of the surface of the die 305 and the testing interface 310 are projected through optics 315 onto imager 320 (illustrated with dotted lines in FIG. 3). Imager 320 is a device that is capable of detecting electromagnetic radiation with spatial resolution, such as, a camera. Imager 320 comprises at least two regions, a first field of view region 321 onto which the image of the device under test 305 is projected and a second field of view region 322 onto which an image of the testing interface 310 is projected. In embodiments of the invention, images from a single corner of the die 305 and a single corner of the testing interface 310 are used to align the contacts on the die with the testing interface 310.

In operation of the alignment stage according to embodiments of the invention, a device to be tested, a packaged or an unpackaged die, is handed off to the thermal control unit (a device having a mechanism to hold the die or a microchannel device, such as thermal control unit 165 of FIG. 1) within the alignment stage using a pick and place head. The vacuum turns on through a solenoid valve and evacuates the lines holding the die up against the thermal control unit. Arm-mounted optics and optional associated light(s) move into the interior of the alignment stage until they are located between the die and the testing interface. The optics project images of the device under test and the testing interface onto the field of view of an imaging system. The imaging system records images projected onto the field of view of the face of the device presented for alignment and testing (the first level interconnects of a die) and the testing interface. A computer running alignment software receives the images from the imager and performs best fit algorithms on the images. The computer commands the motor drives to translate and or rotate the die in the x-y plane to align the connectors on the die surface with the testing interface based on the results of the best fit algorithms. Optionally, the alignment software uses a reference fiducial mark on the die and or on the testing interface. In embodiments of the invention, the alignment occurs using an image of only the single corner of the device under test and of the testing interface. In an embodiment of the invention 1-5% of the area of the face of the die is used for alignment. For dense arrangements of first level interconnects, 1-2% of the area of a die face presents a pattern of more than 30 die interconnect bumps. After alignment of the first level interconnects of a die with the testing interface, the retractable optics retract to enable the die to contact the testing interface.

The actuation member within the alignment stage moves the die into contact with the testing interface by linearly translating the die inside the housing of the alignment stage. The actuation member provides controlled compressive force between the die and the contacts of the testing interface using a predetermined force of position feedback setting. Actuation is controlled using both distance measurements and force feedback. The compressive force is controlled by a computer system running software that uses the output from the force sensor to position the actuation member. After compression of the die against the testing interface, the vacuum is turned off and cooling liquid flow against the backside of the die is provided. The electronic test of the die by the testing tool is executed. After the test, an air purge of the channels in contact with the backside of the die is performed and the vacuum re-applied. The actuation member retracts along the z-axis and the die is removed with a pick and place head. This sequence is then repeated for additional dice.

The co-planarity of the die with the test tooling is facilitated by the assembly of the alignment stage onto the test tooling and the use of a central lapped base plate. In embodiments of the invention, the central lapped base plate is used as datum for the alignment stage and the test tooling. Initial alignment of the test tooling to create planarity between the die and contacts is done using electrical contact resistance, force feedback, and or precision displacement sensors. In embodiments of the invention, no gimbaling mechanism is necessary. In embodiments of the invention, primary gimbal is achieved with a compliant layer of test contacts in the test tooling.

Figure 4A:
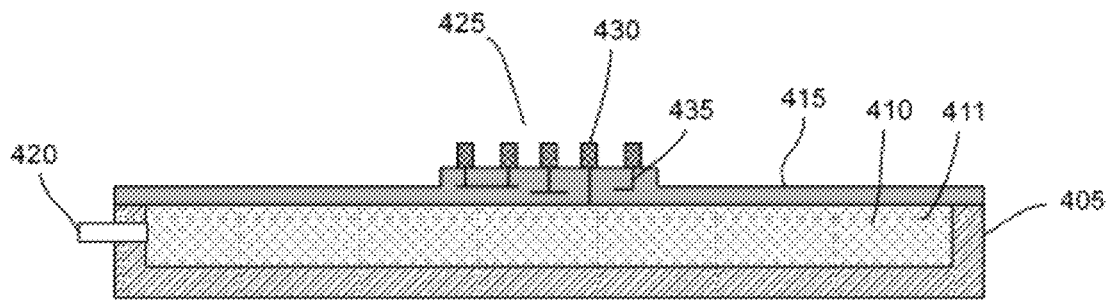
FIGS. 4A-D illustrate electronic interfaces useful for testing semiconductor dice.
Figure 4B:
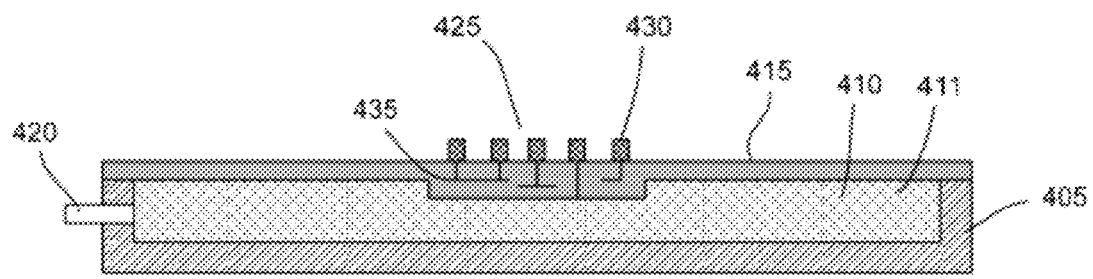

FIGS. 4A-B illustrate test interfaces for forming electrical contacts with the first level interconnects of a die. The test interface is capable of probing micro-chips presenting dense first level interconnect arrays having pitches less than or equal to 100 μm. The test interface is usable with dice that are still in wafer form, dice that are sawn apart but still unpackaged, and packaged dice. The test interfaces according to embodiments of the invention are capable of providing co-planarization of the contactor plane and the die bump plane through the use of a thin membrane. In embodiments of the invention, the membrane is a semiconductor membrane. In embodiments of the invention, the membrane is comprised of silicon. In additional embodiments of the invention, the membrane is comprised of gallium arsenide (GaAs) and or indium antimonide (InSb) or a combination of these with silicon. The membrane can also be comprised of layered composites, such as layer(s) of metal and insulator, or a structural composite, such as a material with an embedded fiber mesh. Alternately, the membrane is comprised of a flexible polymer material used for flexible printed circuit boards, such as FR4, a National Electrical Manufacturers Association (NEMA) grade designation for glass reinforced epoxy laminate. In embodiments of the invention, the membrane has electrically conducting lines (e.g., metal lines) that provide a conductive path from the testing interface to the testing system equipment. The conducting lines can be embedded within the membrane and or located on the surface or backside of the membrane. Typically, the conducting lines extend from the testing interface to the edge(s) of the flexible membrane.

FIGS. 4A-B show a test interface in which an enclosing structure 405 contains a thermal fluid 410. In embodiments of the invention, the thermal fluid 410 is pressurized at a pressure greater than atmospheric pressure. Thermal fluid 410 is, for example, a gas or a thermal grease or oil. Optionally, thermal fluid 410 can also be a gel. A flexible membrane 415 is thermally coupled to thermal fluid 410. Optional ingress 420 port allows the movement of thermal fluid 410 into and out of the cavity 411 formed between enclosing structure 405 and membrane 415. In embodiments of the invention, the optional ingress 420 port is fluidicly connected to a communicating reservoir (not shown) and a pressure control valve (not shown). A thermocouple (not shown) measures the temperature of the thermal fluid 410 and provides feedback to the temperature control unit (not shown). A temperature control unit is thermally coupled to the thermal fluid 410 and is capable of controlling the temperature of the thermal fluid 410.

Flexible membrane 415 houses testing interface region 425 comprising probes 430 that are capable of forming electrical connections with a first level interconnect array of a die. Testing interface region 425 includes space transformation device 435 that provides electrical interconnectivity and allows translation from the device pitch to a larger pitch that allows connectivity to the rest of the test system (not shown). In alternate embodiments, a space transformation device is not integral with the testing interface region, but is instead a separate device that is attached to the testing interface region. In embodiments of the invention, a gross misalignment between the plane of the die bump (the first level interconnect) and the testing interface is capable of being absorbed by the membrane which remains virtually flat in the region under the device under test (in the testing interface region 425), but is capable of flexing in surrounding thinner regions. The membrane 415 in embodiments of the invention has a thickness in the range of 20 μm to 100 μm in the thinner membrane regions surrounding the thicker interface region 425. The thermal fluid 410 provides a suspension system for the membrane 415. In FIG. 4A, the outer surface of the interface region 425 extends out of the membrane 415 toward a device under test. In FIG. 4B, the inner surface of the interface region 425 extends out of the membrane 415 toward the thermal fluid 410. Other configurations are possible, for example, both the outer and inner surface of the interface region 425 can extend beyond the outer and inner surfaces of the remainder of the semiconductor membrane 415. The metal lines 435 of the interface region are created, for example, using standard semiconductor processing techniques including deposition and etching processes.

Figure 4C:
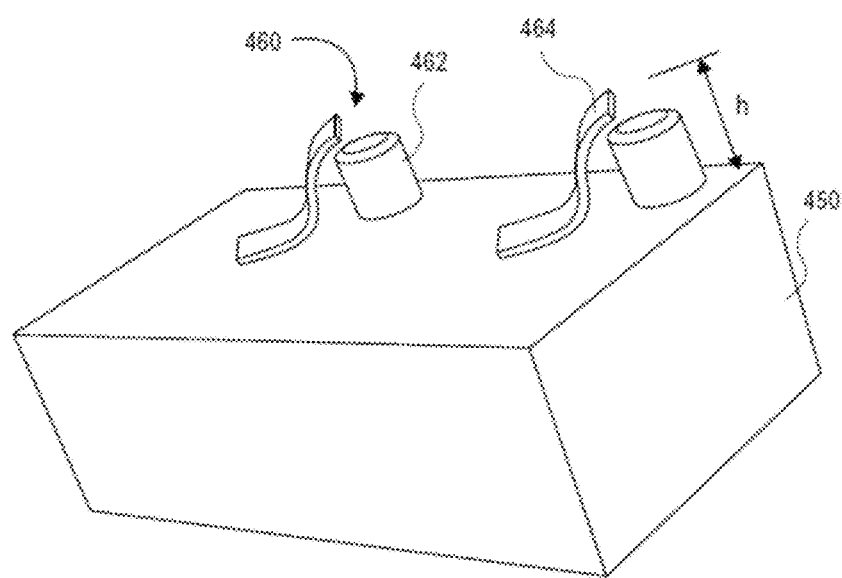

FIG. 4C provides a closer view of probes that are useful, for example, as probes 430 of the testing interfaces of FIGS. 4A-B. In FIG. 4C the testing interface region of a membrane 450 has probes 460. Probes 460 comprise a probe stop 462 and a flexible probe arm 464 attached to the membrane 450. During contact with, for example, the die bumps forming the first level interconnects for the device under test, the flexible probe arm 464 is compressed at most until it is in contact with the probe stop 462. A typical testing interface can contain many thousands of probes, although only two are shown here for illustration. Because the membrane is capable of managing global compliance issues, such as if the die were tilted or slightly warped, the probes 460 can have lesser heights, h, than conventional probes. In embodiments of the invention, the height, h, of the probes 460 is in the range of 10 to 200 μm. In additional embodiments, the height, h, of the probes 460 is in the range of 10 to 150 μm or 25 to 150 μm. In embodiments of the invention, a minimum probe height is proportional to the probe and die level interconnect ("bump" or "pad") height variability. In general, the probes are formed of a material that allows electrical interconnectivity between the probe and the first level interconnects of a device under test, such as a metal or metal alloy material. In additional embodiments of the invention, the probes (the arm 464 and or the stop 462) are comprised of NiCo. Electrical connection takes place through the probe arm 464 and or the stop 462. Probes comprised of NiCo that are 50 μm wide, for example, are capable of accepting stresses of 1.8 GPa. In embodiments of the invention the testing interface of FIGS. 4A-C is used as the testing interface 120 in FIG. 1.

Figure 4D:
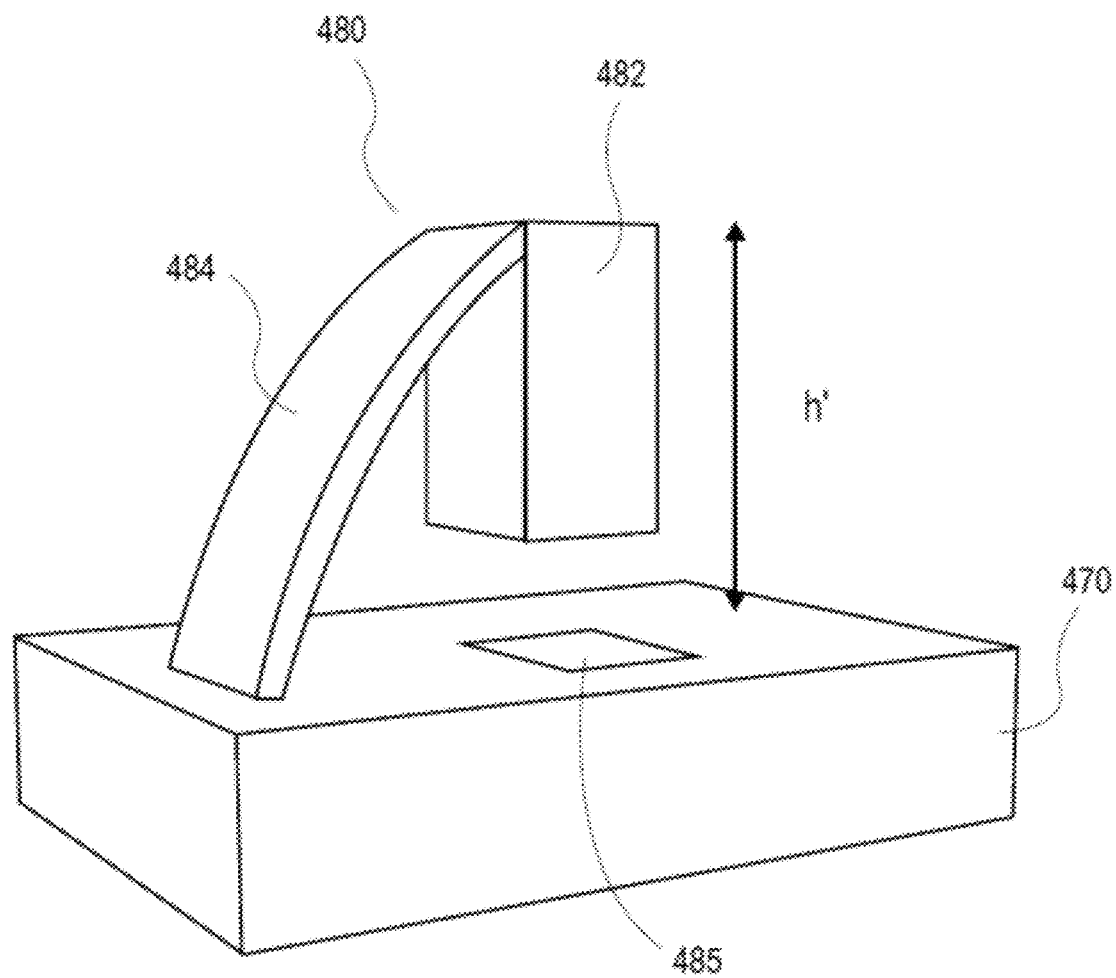

FIG. 4D provides an alternate embodiment of probes useful, for example as probes 430 of the testing interfaces of FIGS. 4A-B. In FIG. 4D, the testing interface region of a membrane 470 has probes 480. The probes 480 comprise a probe stop 482 that is attached to the flexible probe arm 484. Probe arm 484 is attached to probe stop 482. During contact with, for example, the die bumps forming the first level interconnects for the device under test, the flexible probe arm 484 is flexed at most until probe stop 482 is in contact with the landing pad 485 for the probe stop 482. Electrical connectivity can be through the probe arm 484 and or the probe stop 482-landing pad 485. A typical testing interface can contain many thousands of probes, although only one is shown here for illustration. Because the membrane is capable of managing global compliance issues, such as if the die were tilted or slightly warped, the probes 480 can have lesser heights, h, than conventional probes. In embodiments of the invention, the height, h', of the probes 480 is in the range of 10 to 200 μm. In additional embodiments, the height, h', of the probes 460 is in the range of 10 to 150 μm or 25 to 150 μm. In embodiments of the invention, a minimum probe height is proportional to the probe and die level interconnect ("bump" or "pad") height variability. In general, the probes are formed of a material that allows electrical interconnectivity between the probe and the first level interconnects of a device under test, such as a metal or metal alloy material. In additional embodiments of the invention, the probes (the arm 464 and or the stop 462) are comprised of NiCo. Electrical connection takes place through the probe arm 464 and or the stop 462.

Other probe configurations are possible for the probes 430 of FIGS. 4A-B. For example, probes could be cones, domes, blades, and or pyramid shapes. The probes are formed of a material that allows electrical interconnectivity between the probe and the first level interconnects of a device under test, such as a metal or metal alloy material. In further embodiments of the invention, the height of the probe can be in the range of 0 to 200 μm.

Figure 5:
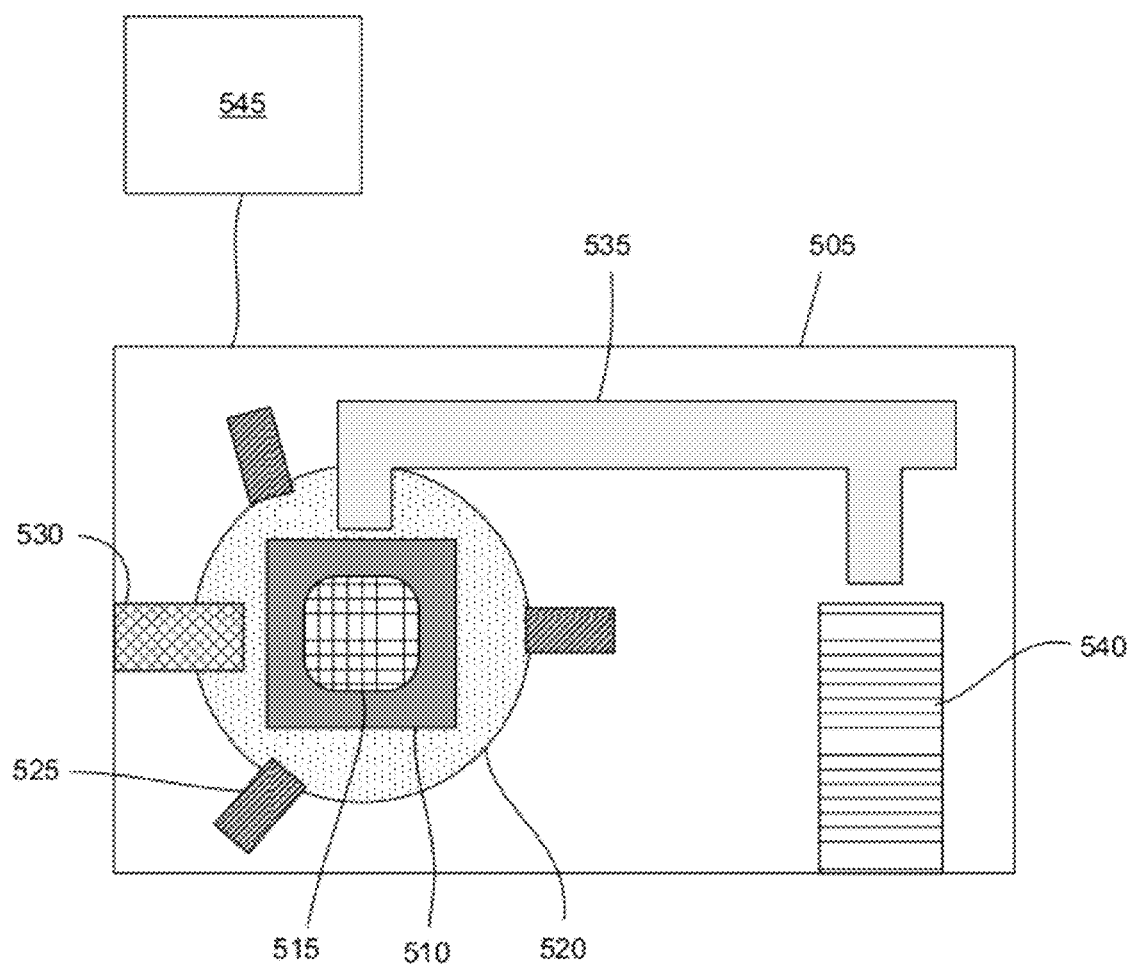
FIG. 5 shows a system useful for die testing.

In FIG. 5 a system for testing dice includes an alignment stage that is capable of high precision alignment and socketing of a packaged or unpackaged die with a testing interface according to embodiments of the invention. The parts of the alignment stage illustrated in FIG. 5 include a surface 505 having a housing 510, a motor 515 capable of linearly translating an actuation member (not shown) within the housing 510, a porous air bearing plate 520, and motors 525 capable of causing XYT (x, y, theta) movement of the porous air bearing plate 520. Housing 510 is fixably attached to the porous air bearing plate 520 and moves with it. A testing interface (not shown) is located below the housing 510. An imaging system 530 having movable optics is capable of imaging the surface of device under test and the testing interface so that the die and the interface can be aligned. A micro-handler for dice 535 (having, for example, a pick-and-place head) is capable of moving dice to and from the dice holder 540 onto the actuation member within the housing 510. The die holder 540 is, for example, a tray, die on mylar film, or a tape and reel device. One or more computers 545 are capable of performing functions such as controlling the operation of the micro-handler 535, receiving input from the imaging system 530, aligning the device under test with the testing interface, operating the vacuum system to attach (and detach) the device under test to (and from) the actuation member, receiving input from the pressure sensors (not shown) and operating motor 515 to contact the device under test with the testing interface, controlling the temperature of the device under test, receiving input from the testing interface, and analyzing the data from the testing interface for the device under test.

A computer includes a processing system, including a processor that is communicatively coupled to one or more volatile or non-volatile data storage devices, such as random access memory (RAM), read-only memory (ROM), mass storage devices such as serial advanced technology attachment (SATA) or small computer system interface (SCSI) hard drives, and or devices capable of accessing media, such as floppy disks, optical storage, tapes, flash memory, memory sticks, CD-ROMs and or digital video disks (DVDs). The term ROM refers to non-volatile memory devices such as erasable programmable ROM (EPROM), electrically erasable programmable ROM (EEPROM), flash ROM, and or flash memory. The processor may also be communicatively coupled to additional components, such as video controllers, SCSI controllers, network controllers, universal serial bus (USB) controllers, devices capable of supply data and other inputs, and user input devices, such as keyboards, touch pads, touch screens, joysticks, and mice. Communications between elements of the computer system, additional processors, and or the electrical usage monitors can occur using various wired and or wireless short range protocols including, USB, WLAN (wireless local area network), radio frequency (RF), satellite, microwave, Institute of Electrical and Electronics Engineers (IEEE) 802.11, Bluetooth, optical, fiber optical, infrared, cables, and lasers.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A device comprising,
   a housing having an end mounted on an air bearing plate,
   an actuation member located within the housing and capable of movement along a first axis within the housing,
   at least one air bearing in the housing and capable of separating the actuation member from an inner side of the housing,
   a first motor mounted on the housing and operably connected to the actuation member and capable of causing the actuation member to move along the first axis,
   one or more manipulators each movably attached at a first end to the air bearing plate and movably attached at a second end to a proximate surface,
   a testing interface wherein the testing interface is capable of forming electrical contacts with a die mounted on the actuation member and wherein the testing interface faces a region of the actuation member that is capable of holding a die, and
   an optical system wherein the optical system comprises optics capable of reflecting an image of a die mounted on the actuation member and an image of the testing interface onto an imaging device capable of detecting the image of the die and the image of the testing interface.

2. The device of claim 1 wherein the actuation member additionally comprises a temperature control unit capable of regulating the temperature of a die when the die is in contact with the testing interface.

3. The device of claim 1 wherein the actuation member additionally comprises a force sensor.

4. The device of claim 1 wherein the optical system comprises optics that are mounted on an arm wherein the arm is capable of moving the optics into and out of an interior region within the housing that is between where a die is mounted for testing and the testing interface.

5. The device of claim 1 wherein the device is capable of aligning dice having interconnects with pitches of 100 μm or less with the interconnects of a testing interface with an alignment accuracy of 3 μm or less.

6. The device of claim 1 wherein the one or more manipulators are capable of causing the rotation and translation of the air bearing plate in a plane perpendicular to the first axis along which the actuation member is capable of moving.

7. The device of claim 1 additionally including a lapped plate that limits the amount of motion available to the air bearing plate in a plane perpendicular to the first axis along which the actuation member is capable of moving.

8. The device of claim 1 wherein the testing interface comprises an enclosed space wherein the enclosed space comprises a thermal fluid, a membrane proximate to the enclosed space comprising the thermal fluid wherein the membrane is attached to a housing that partially surrounds the enclosed space, wherein the membrane is capable of deflecting into the enclosed space, and wherein the membrane comprises a first region having a greater thickness than a second region of the membrane surrounding the first region, and an interface region comprising probes wherein the probes are capable of making electrical contact with the interface presented by a die wherein the interface region is located on the region of the membrane having a greater thickness.

9. The device of claim 8 wherein the height of probes is between 0 μm and 200 μm.

10. The device of claim 8 wherein the thickness of the second region of the membrane is between 20 μm and 100 μm.

11. A device comprising, an enclosed space wherein the enclosed space comprises a thermal fluid, a housing that partially surrounds the enclosed space, a membrane wherein the membrane is attached to the housing that partially surrounds the enclosed space, wherein the membrane is capable of deflecting into the enclosed space, and wherein the membrane comprises a first region having a greater thickness than a second region of the membrane surrounding the first region, and an interface region comprising probes wherein the probes are capable of making electrical contact with an interface presented by a die wherein, the interface region is located on the region of the membrane having a greater thickness, and wherein the probes each comprise a flexible arm and a probe stop configured such that when flexed a free end of the flexible arm is capable of contacting the probe stop.

12. The device of claim 11 additionally comprising a pressure control valve and a reservoir which are both operatively coupled to the enclosed space wherein the pressure valve is capable of regulating the pressure within the enclosed space.

13. The device of claim 11 additionally comprising temperature control elements capable of regulating the temperature of the thermal fluid.

14. The device of claim 11 wherein the height of probes is between 0 μm and 200 μm.

15. The device of claim 11 wherein the thickness of the second region of the membrane is between 20 μm and 100 μm.

16. The device of claim 11 wherein the thermal fluid is a gas.

17. The device of claim 11 wherein the thermal fluid is a liquid.

18. The device of claim 11 wherein the thermal fluid is pressurized.

19. The device of claim 11 wherein the interface region additionally comprises electronic circuitry located within the region of the membrane having a greater thickness.

20. The device of claim 11 wherein the membrane is comprised of a semiconductor material or a polymer material.

21. The device of claim 11 wherein the membrane is comprised of silicon.

* * * * *